(12) United States Patent
Sugiura

(10) Patent No.: US 11,404,941 B2
(45) Date of Patent: Aug. 2, 2022

(54) POWER CONVERSION DEVICE

(71) Applicant: DENSO CORPORATION, Kariya (JP)

(72) Inventor: Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 160 days.

(21) Appl. No.: 16/874,655

(22) Filed: May 14, 2020

(65) Prior Publication Data

US 2020/0366167 A1    Nov. 19, 2020

(30) Foreign Application Priority Data

May 17, 2019    (JP) .............................. JP2019-093615

(51) Int. Cl.
| | |
|---|---|
| *H02K 11/33* | (2016.01) |
| *H02K 11/40* | (2016.01) |
| *B60R 16/03* | (2006.01) |
| *B62D 5/04* | (2006.01) |
| *H05K 1/02* | (2006.01) |

(Continued)

(52) U.S. Cl.
CPC ............. *H02K 11/33* (2016.01); *H02K 11/40* (2016.01); *B60R 16/03* (2013.01); *B62D 5/04* (2013.01); *H02K 2211/03* (2013.01); *H02K 2213/06* (2013.01); *H05K 1/0298* (2013.01); *H05K 1/036* (2013.01); *H05K 1/185* (2013.01)

(58) Field of Classification Search
CPC ........ H02K 11/33; H02K 5/225; H02K 11/40; H02K 1/185; H02K 2213/06; H02K 2211/03; H02K 11/30; H02K 11/35; H02K 11/38; H02K 9/227; B62D 5/046; B62D 5/0406; B62D 5/04; H05K 1/036; H05K 1/0298; B60R 16/03

USPC ................................................... 310/68 R, 64
See application file for complete search history.

(56) References Cited

U.S. PATENT DOCUMENTS

| | | | |
|---|---|---|---|
| 2012/0286602 A1 | 11/2012 | Uchida et al. | |
| 2015/0189734 A1* | 7/2015 | Nishimoto | ........... H05K 3/3415 |
| | | | 701/41 |
| 2016/0036288 A1 | 2/2016 | Yamasaki et al. | |

(Continued)

FOREIGN PATENT DOCUMENTS

JP    2013-232654 A    11/2013

OTHER PUBLICATIONS

U.S. Appl. No. 16/874,651 and its entire file history, filed May 14, 2020, Kurihara et al.

(Continued)

*Primary Examiner* — Quyen P Leung
*Assistant Examiner* — Alexander A Singh
(74) *Attorney, Agent, or Firm* — Maschoff Brennan

(57) ABSTRACT

A power conversion device comprise: a power conversion circuit that is configured to convert a supplied electric power to output the converted power; a control circuit that is configured to control an operation of the power conversion circuit; a multilayer substrate that has a different layers, power wiring patterns of the power conversion circuit and a control wiring pattern of the control circuit being arranged on the multilayer substrate, the power wiring patterns being disposed in different layers of the multilayer substrate; a via that extends across the power wiring patterns in the different layers; and a solid-shaped conductive member that is provided in the via to electrically connect the respective power wiring patterns to each other.

7 Claims, 10 Drawing Sheets

(51) Int. Cl.
    *H05K 1/03*           (2006.01)
    *H05K 1/18*           (2006.01)

(56)           References Cited

U.S. PATENT DOCUMENTS

2018/0201302 A1*   7/2018   Sonoda  ............... H02K 11/215
2019/0052154 A1    2/2019   Sugiura
2019/0126972 A1*   5/2019   Okamura  ............ H05K 1/0206
2019/0393873 A1*  12/2019   Watanabe  ........... H05K 1/0262

OTHER PUBLICATIONS

U.S. Appl. No. 16/874,652 and its entire file history, filed May 14, 2020, Sugiura.
U.S. Appl. No. 16/874,656 and its entire file history, filed May 14, 2020, Abe et al.

* cited by examiner

POWER CONVERSION DEVICE

CROSS REFERENCE TO RELATED APPLICATION

This application is based on Japanese Patent Application No. 2019-093615 filed on May 17, 2019, the disclosure of which is incorporated herein by reference.

TECHNICAL FIELD

The disclosure herein relates to a power conversion device for converting a supplied power to output the converted power.

BACKGROUND

A power conversion device may include an inverter circuit as a power conversion circuit and a control circuit for controlling the operation of the inverter circuit. A power wiring pattern included in the power conversion circuit and a control wiring pattern included in the control circuit may be formed on one common substrate. As a result, an installation space of the substrate can be reduced and the device can be miniaturized.

SUMMARY

The present disclosure describes a power conversion device comprising: a power conversion circuit; a control circuit; a multilayer substrate that has a different layers; a via that extends across power wiring patterns in the different layers; and a solid-shaped conductive member that is provided in the via to electrically connect the respective power wiring patterns to each other.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
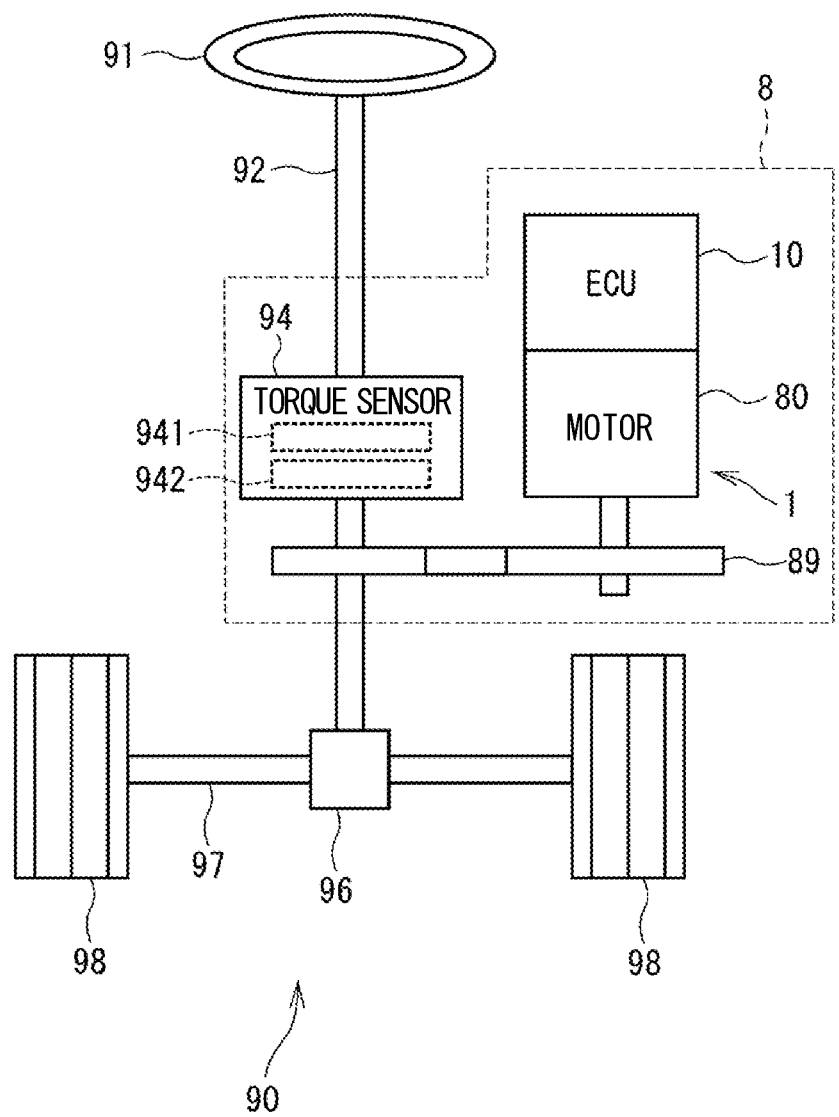
FIG. 1 is a schematic configuration diagram showing a steering system according to a first embodiment.

In a wiring (also referred to as a power wiring pattern) of an inverter circuit, it may be desirable to increase the thickness of the wiring to lower the impedance in order to reduce a heat generation caused by a large current flow. When the wiring is thickened, a wiring width and a wiring gap may enlarge due to a substrate manufacturing restriction, and a fine wiring may not be formed. It may be unsuitable to wire a control circuit requiring a high-density layout. A wire for a control circuit may be referred to as a control wiring pattern. If both the power conversion circuit and the control circuit are provided on a common single substrate to achieve miniaturization, it may be required to achieve both a reduction in impedance and the miniaturization of wiring.

The present disclosure describes a power conversion device capable of realizing both a reduction in impedance and the miniaturization of wiring.

According to one aspect of the present disclosure, a power conversion device may comprise: a power conversion circuit that is configured to convert a supplied electric power to output the converted power; a control circuit that is configured to control an operation of the power conversion circuit; a multilayer substrate that has a different layers, power wiring patterns of the power conversion circuit and a control wiring pattern of the control circuit being arranged on the multilayer substrate, the power wiring patterns being disposed in different layers of the multilayer substrate; a via that extends across the power wiring patterns in the different layers; and a solid-shaped conductive member that is provided in the via to electrically connect the respective power wiring patterns to each other.

In the power conversion device, a multilayer substrate is used as a substrate on which both the power wiring pattern and the control wiring pattern are provided. The power wiring patterns disposed in different layers of the multilayer substrate are electrically connected to each other by solid-shaped conductive members (corresponding to solid vias) provided in the vias. In the case of the solid vias, the electrical resistance between the layers can be reduced as compared with the case of a plating (corresponding to film vias) formed in a film on the inner surfaces of the vias.

Therefore, according to the above disclosure in which the power wiring patterns are disposed in the respective different layers of the multilayer substrate and the power wiring patterns are connected to each other by the vias, the power wiring patterns of the multiple layers can be made to have an impedance equivalent to that of a single layer of thick wiring. In addition, since the via is a solid via, the impedance can be further reduced as compared with the case of a film via. In other words, the impedance can be lowered without thickening the power wiring pattern, and heat generation caused by allowing a large current to flow can be reduced. In addition, since the thickening of the power wiring pattern can be inhibited, the wiring width and the wiring gap of the control wiring pattern can be reduced, and fine wiring can be provided.

Multiple embodiments of the present disclosure will be described with reference to the drawings. Incidentally, the same reference numerals are assigned to corresponding components in each embodiment, and therefore duplicate descriptions may be omitted. When only a part of the configuration is described in each embodiment, the configuration of the other embodiments described above can be applied to other parts of the configuration.

First Embodiment

As shown in FIG. 1, a drive device 1 according to the present embodiment includes an electric motor 80 and an electronic control unit (ECU) 10 as a power conversion device. The drive device 1 is applied to an electric power steering device (referred to as an EPS 8) for assisting steering operation of a vehicle. FIG. 1 shows an entire configuration of a steering system 90 including the EPS 8. The steering system 90 includes a steering wheel 91 as a steering member, a steering shaft 92, a pinion gear 96, a rack shaft 97, wheels 98, the EPS 8, and the like.

The steering wheel 91 is connected to the steering shaft 92. The steering shaft 92 is provided with a torque sensor 94 for detecting a steering torque. The torque sensor 94 has two torque detection units 941 and 942 provided for each system. Detection values of the torque detection units 941 and 942 are output to the microcomputers 170 and 270, which are corresponding microcomputers (see FIG. 3). The pinion gear 96 is provided at a tip of the steering shaft 92. The pinion gear 96 meshes with the rack shaft 97. The pair of wheels 98 is connected to both ends of the rack shaft 97 through tie rods or the like.

When a driver rotates the steering wheel 91, the steering shaft 92 connected to the steering wheel 91 rotates. A rotational motion of the steering shaft 92 is converted into a linear motion of the rack shaft 97 by the pinion gear 96. The pair of wheels 98 are steered to an angle corresponding to the amount of displacement of the rack shaft 97.

The EPS 8 includes the drive device 1, a reduction gear 89 as a power transmission portion for reducing a rotational speed of the motor 80 and transmitting the rotational speed to the steering shaft 92. The steering shaft 92 is a drive target of the EPS 8.

Figure 2:
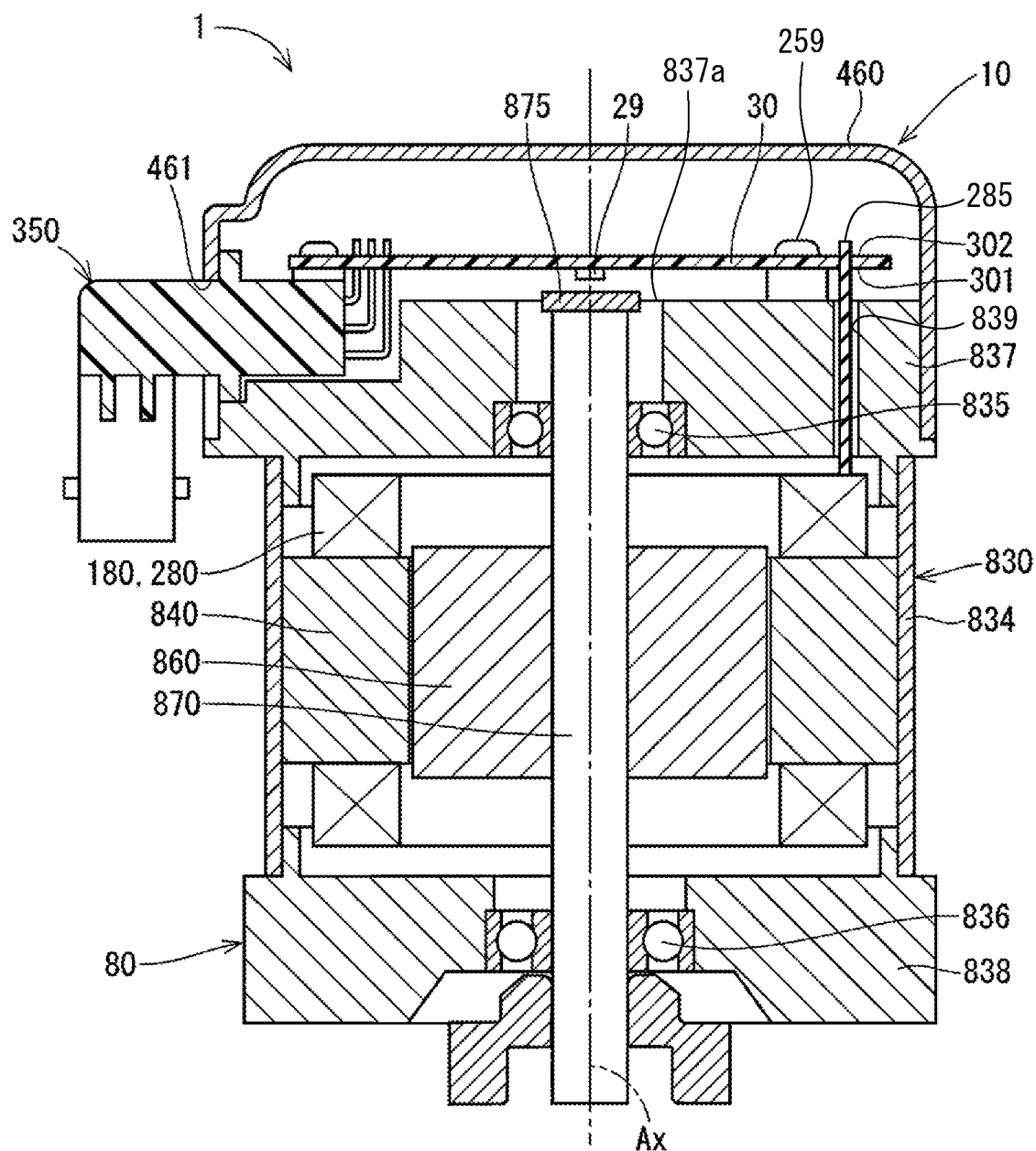
FIG. 2 is a cross-sectional view of a drive device applied to the steering system shown in FIG. 1.
Figure 3:
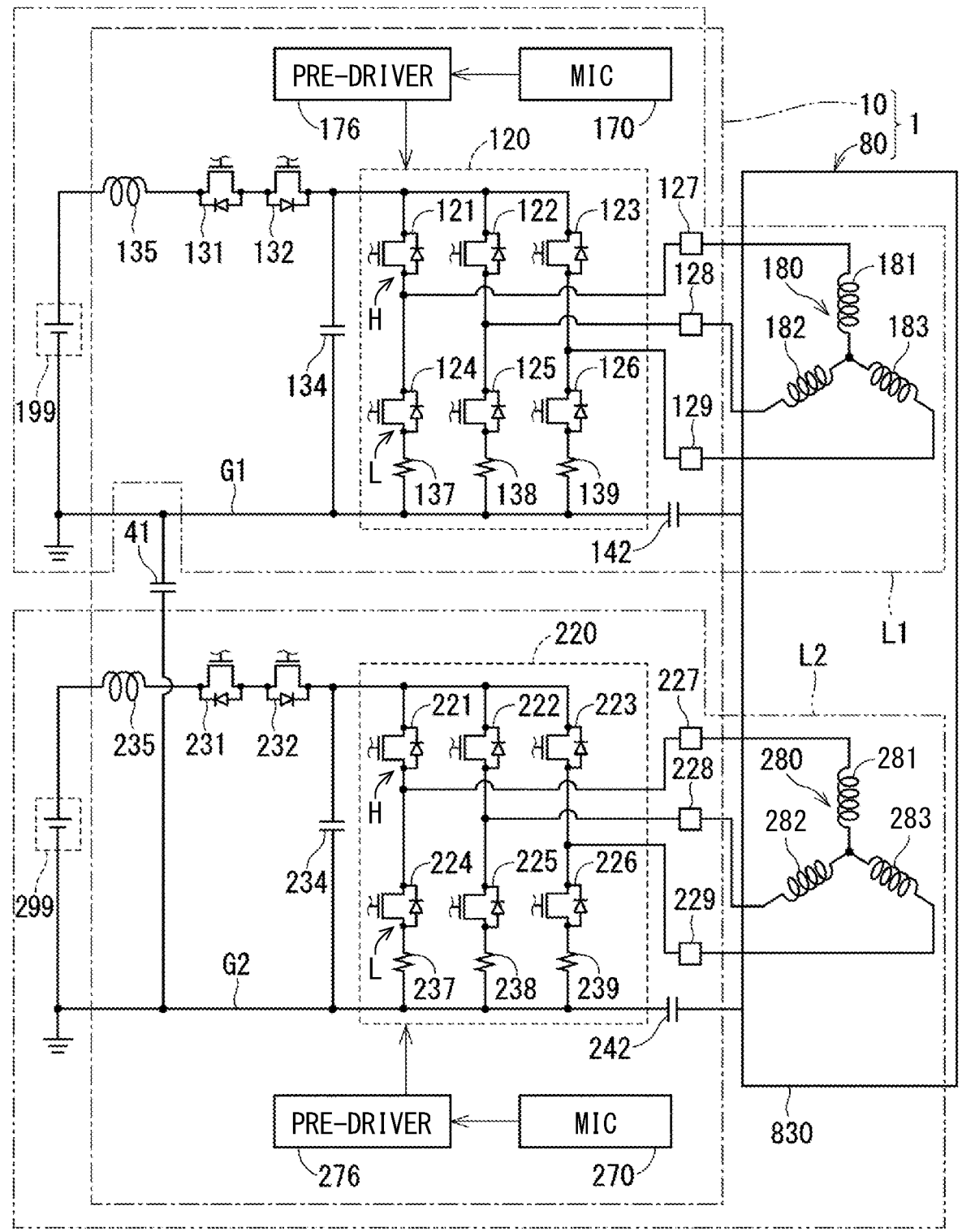
FIG. 3 is a circuit diagram of the drive device shown in FIG. 2.

As shown in FIGS. 2 and 3, the motor 80 is a three-phase brushless motor. The motor 80 outputs part or all of a torque required for steering, and is driven by a power supplied from batteries 199 and 299 to rotate the reduction gear 89 forward and backward.

The motor 80 has a first winding 180 and a second winding 280 as a winding set. The windings 180 and 280 have equivalent electrical characteristics and are cancel-wound on a common stator 840 with electrical angles shifted by 30 [deg] from each other. In response to the above configuration, the windings 180 and 280 are controlled to be energized with a phase current whose phase φ is shifted by 30 [deg].

A combination of configurations relating to an energization control of the first winding 180 is referred to as a first system L1. A combination of configurations relating to am energization control of the second winding 280 is referred to as a second system L2. The configuration of the first system L1 is mainly numbered in the 100's, the configuration of the second system L2 is mainly numbered in the 200's, and the configurations substantially similar to each other in the systems L1 and L2 are numbered so that the last two digits are the same, and a description of those configurations will be omitted as appropriate.

As shown in FIG. 2, the drive device 1 has the ECU 10 integrally provided on one side of the motor 80 in an axial direction, which is so-called "electromechanical integrated type" or is referred to as a "machine/electricity integral type". The ECU 10 is provided on the other side of the reduction gear 89 with respect to the motor 80. The ECU 10 is disposed coaxially with a center line Ax of a rotation shaft 870. With the electromechanical integrated type, the ECU 10 and the motor 80 can be efficiently placed in a vehicle having a limited mounting space. When simply referred to as "axial direction" or "radial direction" as appropriate, the axial direction or the radial direction of the motor 80 is meant.

The motor 80 includes a stator 840, a rotor 860, a rotation shaft 870, and a housing 830 that accommodates the stator 840, the rotor 860, the rotation shaft 870, and the like. The stator 840 is fixed to the housing 830, and the windings 180 and 280 are wound around the stator 840. The rotor 860 is provided radially inward of the stator 840 and rotatable relative to the stator 840.

The rotation shaft 870 is fitted into the rotor 860, and rotates integrally with the rotor 860. The rotation shaft 870 is rotatably supported by the housing 830 by the aid of bearings 835 and 836. An end of the rotation shaft 870 on the ECU 10 side protrudes from the housing 830 toward the ECU 10 side. A magnet 875 as a detection target is provided at the end of the rotation shaft 870 on the ECU 10 side.

The housing 830 has a cylindrical case 834, a rear frame end 837 provided at one end of the case 834, and a front frame end 838 provided at the other end of the case 834.

An opening 837a through which the rotation shaft 870 is inserted and disposed is provided in the rear frame end 837. A lead wire insertion hole 839 is provided in the rear frame end 837. A lead wire 285 connected to each phase of the windings 180 and 280 is inserted into the lead wire insertion hole 839. The lead wire 285 is taken out from the lead wire insertion hole 839 to the ECU 10. The lead wire 285 is inserted through motor wire connection portions 186 and 286 (see FIGS. 4 and 5) and connected to a substrate 30 by solder or the like.

The ECU 10 includes the substrate 30 and various electronic components mounted on the substrate 30. The substrate 30 is fixed to a surface of the rear frame end 837 opposite to the motor 80 by bolts 259 (see FIG. 2) inserted through substrate connection portions 155 and 255. The bolts 259 are made of a conductive material. A surface of the substrate 30 on the motor 80 side is defined as a motor surface 301, and the surface of the substrate 30 on the opposite side to the motor 80 is defined as a cover surface 302. The cover 460 is formed in a substantially bottomed cylindrical shape and fits radially outward of the rear frame end 837. The cover 460 is provided so as to cover the substrate 30, and protects the ECU 10 from an external impact, and prevents entry of dust, water, or the like into the ECU 10. An opening 461 is provided on a side surface of the cover 460.

The connector 350 has connector terminals such as a first power supply terminal, a first ground terminal, a first signal terminal, a second power supply terminal, a second ground terminal, and a second signal terminal. Each of the first power supply terminal, the first ground terminal, and the first signal terminal is inserted from the motor surface 301 side of the substrate 30, and electrically connected to a first power supply terminal connection portion 151, a first ground terminal connection portion 152, and a first signal terminal connection portion 153 (see FIGS. 4 and 5). Each of the second power supply terminal, the second ground terminal, and the second signal terminal is inserted from the motor surface 301 side of the substrate 30, and electrically connected to the second power supply terminal connection portion 251, the second ground terminal connection portion 252, and the second signal terminal connection portion 253 (see FIGS. 4 and 5).

FIG. 3 shows a circuit configuration of the drive device 1. The ECU 10 includes a first inverter 120, first motor relays 127 to 129, first power supply relays 131 and 132, a first capacitor 134, and a first coil 135, which are provided corresponding to the first winding 180. The ECU 10 further includes second inverter 220, second motor relays 227 to 229, second power supply relays 231 and 232, a second capacitor 234, and a second coil 235, which are provided corresponding to the second winding 280.

The first inverter 120 and the like of the first system L1 are supplied with an electric power from the first battery 199. The second inverter 220 and the like of the second system L2 are supplied with an electric power from the second battery 299. In the present embodiment, the ground is also separated by the first system L1 and the second system L2. The first microcomputer 170 controls the energization of the first winding 180, and the second microcomputer 270 controls the energization of the second winding 280. In other words, in the present embodiment, the first system L1 and the second system L2 are provided independently of each other in a completely redundant configuration.

The first inverter 120 is a three-phase inverter, and the first switching elements 121 to 126 are connected in a bridge manner. The switching elements 121 to 123 are connected to a high potential side to form an upper arm H. The switching elements 124 to 126 are connected to a low potential side to form a lower arm L. A connection point of the paired U-phase switching elements 121 and 124 is connected to one end of a first U-phase coil 181. A connection point of the paired V-phase switching elements 122 and 125 is connected to one end of a first V-phase coil 182. A connection point of the paired W-phase switching elements 123 and 126 is connected to one end of a first W-phase coil 183. The other ends of the coils 181 to 183 are connected to each other. Shunt resistors 137 to 139, which are current detection elements for detecting currents flowing in the coils 181 to 183, are provided on the low potential side of the switching elements 124 to 126, respectively. The high potential side may be referred to as a high electric potential side, and the low potential side may be referred to as a low electric potential side.

The second inverter 220 has the same configuration as that of the first inverter 120. In other words, the switching elements 221 to 223 are connected to a high potential side to form an upper arm H. The switching elements 224 to 226 are connected to a low potential side to form a lower arm L. Output points of the upper and lower arm circuits of the respective UVW-phases are connected to the respective UVW-phase coils. Shunt resistors 237 to 239, which are current detection elements for detecting currents flowing in the coils 281 to 283, are provided on the low potential side of the switching elements 224 to 226.

The first motor relays 127 to 129 are provided between the first inverter 120 and the first winding 180, and are provided so that the first inverter 120 and the first winding 180 can be disconnected from each other and connected to each other. The U-phase motor relay 127 is provided between the connection point of the switching elements 121 and 124 and the U-phase coil 181. The V-phase motor relay 128 is provided between the connection point of the switching elements 122 and 125 and the V-phase coil 182. The W-phase motor relay 129 is provided between the connection point of the switching elements 123 and 126 and the W-phase coil 183. The second motor relays 227 to 229 have the same configuration as that of the first motor relays 127 to 129, and are provided for the respective UVW-phases.

The first power supply relays 131 and 132 are connected in series with each other so that orientations of parasitic diodes are opposite to each other, and are provided between the first battery 199 and the first inverter 120. The second power supply relays 231 and 232 are connected in series with each other so that orientations of parasitic diodes are opposite to each other, and are provided between the second battery 299 and the second inverter 220. This prevents a current from flowing in a reverse direction and protects the ECU 10 if the batteries 199 and 299 are incorrectly connected in the reverse direction.

The pre-driver 176 outputs a drive signal based on a control signal from the first microcomputer 170. The first switching elements 121 to 126, the first motor relays 127 to 129, and the first power supply relays 131 and 132 are controlled to be turned on and off according to the drive signal. The pre-driver 276 of the second system L2 functions in the same manner as the pre-driver 176 of the first system L1. In other words, the second switching elements 221 to 226, the second motor relays 227 to 229, and the second power supply relays 231 and 232 are on-off controlled by the pre-driver 276. In order to avoid complication of the drawings, control lines to the motor relays and the power supply relays are omitted in FIG. 3.

The first capacitor 134 is connected in parallel with the first inverter 120, and the second capacitor 234 is connected in parallel with the second inverter 220. The capacitors 134 and 234 are formed of, for example, aluminum electrolytic capacitors. The first coil 135 is provided between the first battery 199 and the first power supply relay 131, and the second coil 235 is provided between the second battery 299 and the second power supply relay 231.

The first capacitor 134 and the first coil 135, and the second capacitor 234 and the second coil 235 each form a filter circuit. Those filter circuits reduce noise transmitted from other devices sharing the batteries 199 and 299. In addition, the filter circuits reduce the noise transmitted from the drive device 1 to the other devices sharing the batteries 199 and 299. In addition, the capacitors 134 and 234 store electric charges, thereby assisting a power supply to the inverters 120 and 220.

An inter-system ground connection capacitor 41 connects a first system ground G1 and a second system ground G2. A first electromechanical connection capacitor 142 connects the first system ground G1 and the housing 830 of the motor 80. A second electromechanical connection capacitor 242 connects the second system ground G2 and the housing 830. The capacitors 41, 142, and 242 are formed of, for example, ceramic capacitors.

Figure 4:
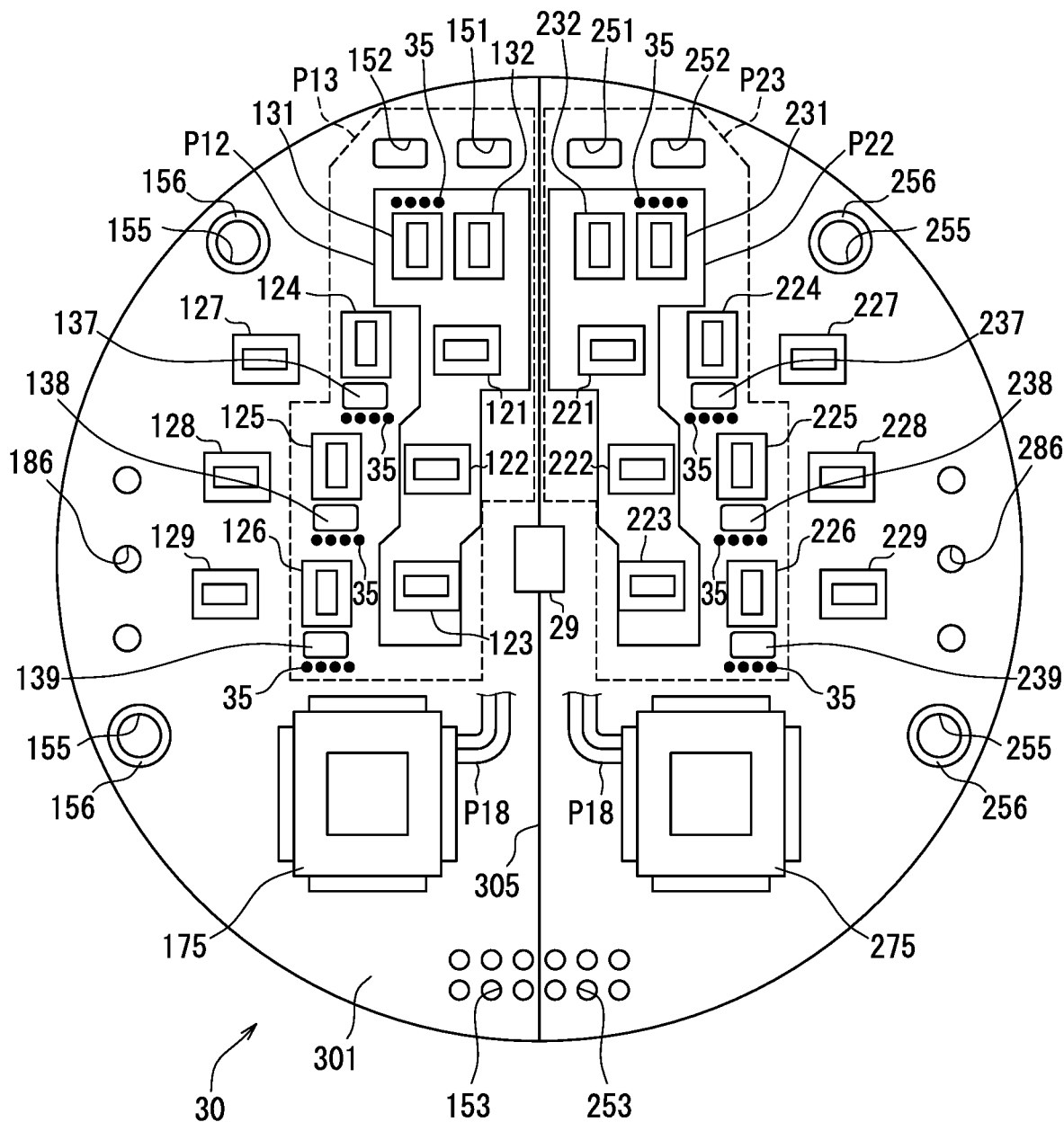
FIG. 4 is a bottom view of an inverter applied to the drive device shown in FIG. 2, when viewed from a side of a motor.
Figure 5:
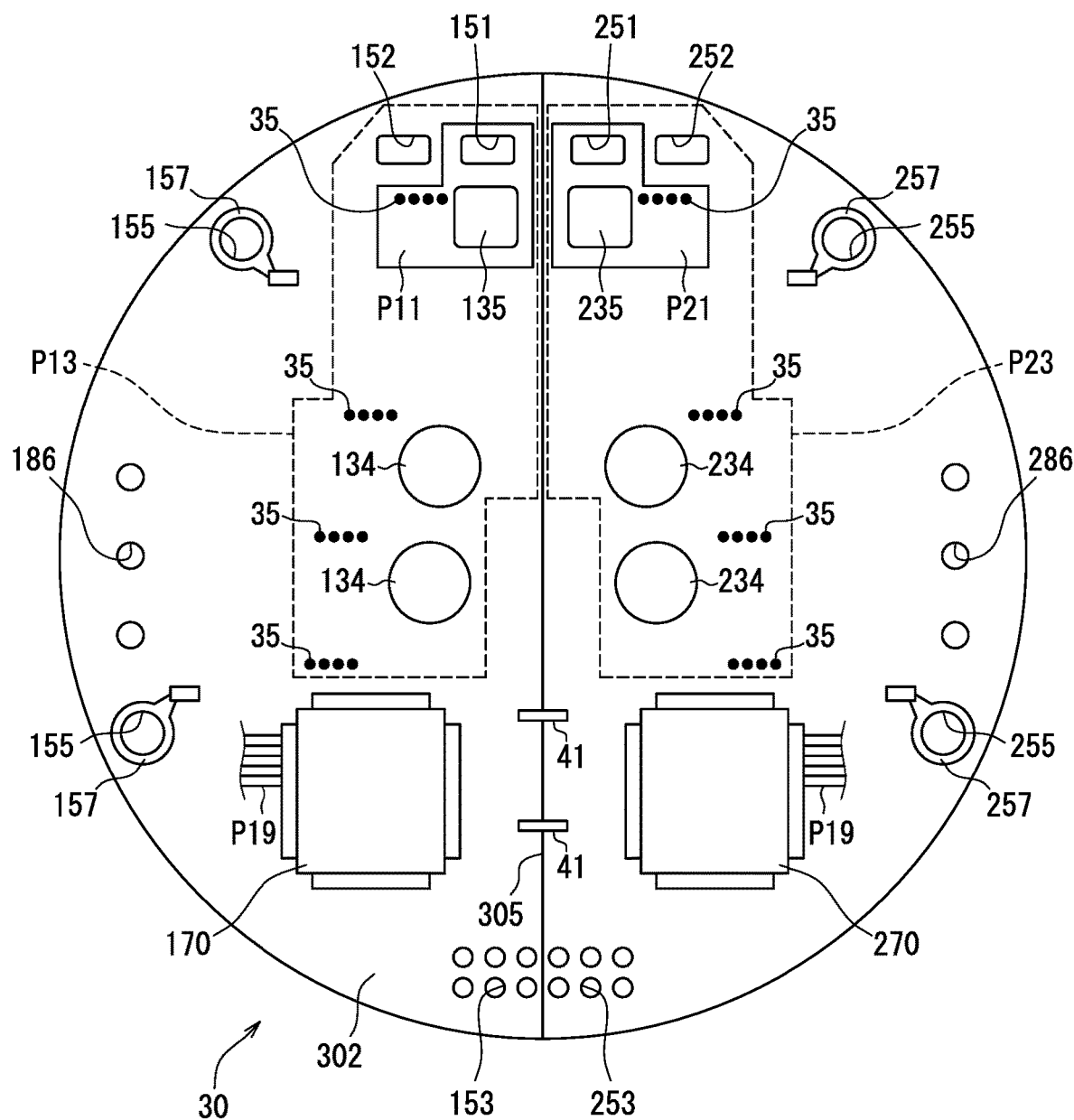
FIG. 5 is a top view of the inverter applied to the drive device shown in FIG. 2, when viewed from an opposite side of the motor.

The motor surface 301 of the substrate 30 is shown in FIG. 4, and the cover surface 302 is shown in FIG. 5. For the sake of description, the placement of the cover surface 302 is reversed, and the first system L1 is shown on a left side and the second system L2 is shown on a right side of a plane of paper.

As shown in FIG. 4, the switching elements 121 to 126 and 221 to 226 and the shunt resistors 137 to 139 and 237 to 239 are mounted on the motor surface 301 of the substrate 30. The motor relays 127 to 129 and 227 to 229, and the power supply relays 131, 132, 231, and 232 are mounted on the motor surface 301. Further, integrated ICs 175 and 275 and a rotation angle sensor 29 (corresponding to a sensor element) are mounted on the motor surface 301.

The integrated IC 175 includes the pre-driver 176, and the integrated IC 275 includes the pre-driver 276. The rotation angle sensor 29 detects a change in a magnetic field by the magnet 875 provided on the rotation shaft 870, and outputs a detection signal corresponding to a rotation angle of the rotation shaft 870. As shown in FIG. 5, the capacitors 134 and 234 and the coils 135 and 235 are mounted on the cover surface 302 of the substrate 30. Further, the inter-system ground connection capacitor 41, the electromechanical connection capacitors 142 and 242 (see FIG. 3), and the microcomputers 170 and 270 are mounted on the cover surface 302.

As shown in FIGS. 4 and 5, the substrate 30 is electrically separated into two pieces by a slit 305. Parts relating to the first system L1 are mounted on the motor surface 301 and the cover surface 302 in one region. Parts relating to the second system L2 are mounted on the motor surface 301 and the cover surface 302 in the other region.

The rotation angle sensor 29 is disposed in a region of the substrate 30 facing the opening 837*a* of the rear frame end 837 (corresponding to an opening facing region). The rotation angle sensor 29 is mounted across the slit 305 on the motor surface 301. The inter-system ground connection capacitor 41 is mounted across the slit 305 on the cover surface 302, and connects the first system ground G1 and the second system ground G2.

The first electromechanical connection capacitor 142 connects the ground pattern P13 of the first system L1 (see FIG. 5) and the housing connection pattern 157. The second electromechanical connection capacitor 242 connects the ground pattern P23 of the second system L2 (see FIG. 5) and the housing connection pattern 257. The housing 830 is connected to the vehicle ground. In other words, the capacitors 41, 142, and 242 are all capacitors for connecting between the grounds. Further, it is conceivable that the inter-system ground connection capacitor 41 connects between the grounds of the power system circuits of the systems L1 and L2.

In the present embodiment, the drive device 1 is applied to the EPS 8, and a large current is supplied in a short time, so that switching noise and ringing noise may be generated. The noise N described above may be generated mainly in a circuit of the ECU 10, and the generated noise may propagate to the vehicle side through the connector 350 and the motor 80. Therefore, the ground of the substrate 30 and the housing 830 are electrically connected to each other by use of bolts to form a noise feedback path from the motor 80 toward the ECU 10. As a result, the noise generated in the circuit of the ECU 10 is fed back to a noise source, and the noise is inhibited from propagating to the vehicle side.

Figure 6:
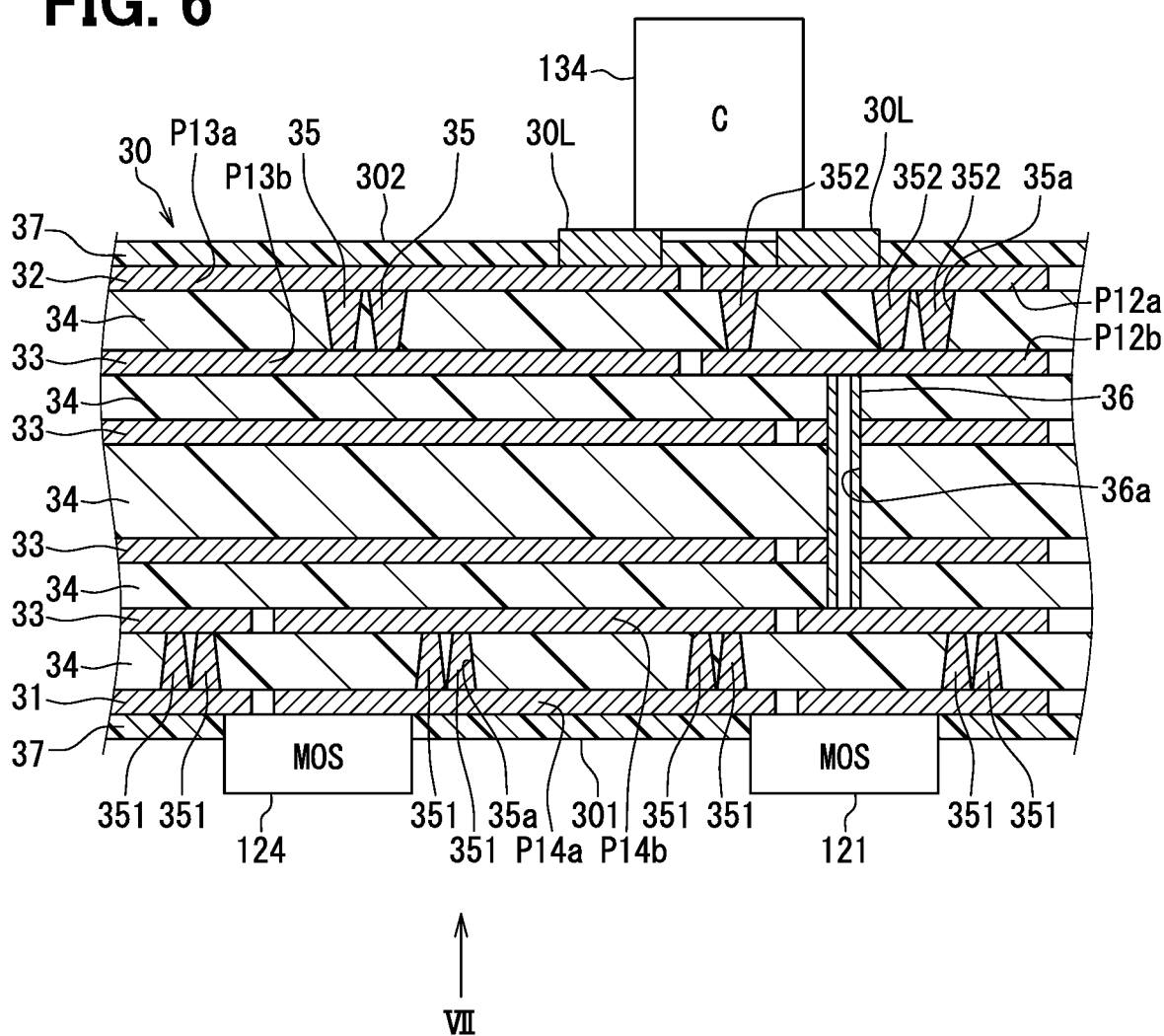
FIG. 6 is a cross-sectional view of the inverter according to the first embodiment.

As shown in FIG. 6, a multilayer substrate is used as the substrate 30 according to the present embodiment. Multiple wiring layers, multiple insulating layers 34, surface resist layers 37, vias, and the like are formed in the substrate 30. Conductive wirings are provided in the wiring layers. The insulating layer 34 having an electrical insulation property is disposed between the adjacent wiring layers.

The wiring layers include surface layers 31 and 32 and inner layers 33. The surface layers 31 and 32 are outermost layers of all the wiring layers. The inner layers 33 are layers located inside the entire wiring layers. In an example of FIG. 6, the inner layers 33 include four layers (multiple layers). The surface layers 31 and 32 are covered with surface resist layers 37. The surface resist layer 37 covering the surface layer 31 forms the motor surface 301. The surface resist layer 37 covering the surface layer 32 forms the cover surface 302.

The vias include through-hole vias (not illustrated) and inner vias 35*a* and 36*a*. The through-hole vias are shaped to penetrate through all of the surface layers 31, 32 and the inner layers 33 (all wiring layer). The inner vias 35*a* are shaped to extend across one of the surface layers 31 and 32 and one inner layer 33 adjacent to the one surface layer. The inner via 36*a* is shaped to extend across all the inner layers 33 except for the surface layers 31 and 32. The inner vias 35*a* are provided by laser machining, and the inner via 36*a* is provided by drilling.

Inner surfaces of the through-hole vias and the inner via 36*a* are subjected to plating 36 as conductive members. The plating 36 is cylindrically shaped to provide a space inside. A non-conductive member (not shown) is packed inside the cylinder of the inner via 36*a*. On the other hand, a conductive member is buried in each of the inner vias 35*a*. The conductive member has a solid shape and is referred to as a solid via 35. The solid vias 35 and the plating 36 electrically connect wiring patterns formed in arbitrary wiring layers. Specific examples of a material of the plating 36 and the solid vias 35 include copper.

A part of the wiring pattern formed in the wiring layer functions as a wiring for connecting the electronic components shown in FIG. 3. The wiring patterns includes power wiring patterns included in the inverters 120 and 220 and control wiring patterns P18 and P19 included in the control circuit. The power wiring patterns include the ground patterns P13 and P23 and the power supply patterns P11, P12, P21, and P22. Further, the power wiring patterns include output patterns P14*a* and P14*b* shown in FIG. 6 and the like. The output patterns P14*a* and P14*b* are wiring patterns for connecting the upper arm H, the lower arm L, and the motor relay 127. Those patterns are provided in each of the first system L1 and the second system L2.

(Details of Ground Pattern)

The ground patterns P13 and P23 provide a part of the grounds G1 and G2, and are electrically connected to the ground terminal connection portions 152 and 252. The ground patterns P13 and P23 are electrically connected to the electromechanical connection capacitors 142 and 242 and the inter-system ground connection capacitor 41 in the surface layer 32 on the cover surface 302 side. The respective ground patterns P13 and P23 are electrically connected to low-potential side terminals of the capacitors 134 and 234 and the shunt resistors 137 to 139 and 237 to 239 in the surface layer 31 on the motor surface 301 side.

The ground patterns P13 and P23 shown in FIG. 4 and FIG. 5 are parts of the ground patterns provided in all the wiring layers, and the other ground patterns are omitted in the drawing. The ground patterns P13 and P23 are provided on the inner layer 33.

The power wiring patterns of the same systems provided in different wiring layers are connected to each other by the multiple solid vias 35 and the plating 36. For example, in FIGS. 4 and 5, the ground pattern of the surface layer 31 (not shown) connected to the low-potential side terminals of the shunt resistors 137 to 239 and the ground patterns P13 and P23 of the inner layers 33 are connected to each other by the multiple solid vias 35 and the plating 36.

As shown in FIG. 6, the ground patterns P13*b* of the inner layers 33 and the ground pattern P13*a* provided on the surface layer 32 are connected to each other by the multiple solid vias 35. The power supply patterns P12*a* of the inner layers 33 and the power supply pattern P12*b* provided on the surface layer 32 are connected to each other by the multiple solid vias 35. The solid vias 35 are disposed so as not to overlap with lands 30L formed on the surface layer 32 when viewed from a plate surface perpendicular direction. In other words, the solid vias 35 are disposed so as to be out of lands 30L in a direction perpendicular to a plate surface. The solid vias 35 described above are referred to as land outside solid vias 352 (corresponding to a land outside conductive members).

The plate surface perpendicular direction corresponds to a direction perpendicular to the plate surface of a substrate.

The plating 36 of the inner via 36a connected to the land outside solid vias 352 and connecting the inner layers 33 to each other is also called an inner layer via. The inner layer via connected to the land outside solid via 352 among the inner layer vias is disposed so as to overlap with the lands 30L when viewed from the plate surface perpendicular direction (see FIG. 6).

The ground pattern P13 of the first system L1 is shaped to include the whole of the power supply relays 131 and 132, the switching elements 121 to 126, and the shunt resistors 137 to 139 when viewed from the direction perpendicular to the plate surface of the substrate 30 (corresponding to a plate surface perpendicular direction). Similarly, the ground pattern P23 of the second system L2 is shaped to include the whole of the power supply relays 231 and 232, the switching elements 221 to 226, and the shunt resistors 237 to 239 when viewed from the plate surface perpendicular direction. In other words, all of the components such as the power supply relays 231 and 232, the switching elements 221 to 226, and the shunt resistors 237 to 239 are overlapped with the ground patterns P13 and P23 when viewed from the plate surface perpendicular direction.

The coils 135 and 235 and the capacitors 134 and 234 provided on the cover surface 302 are also entirely overlapped with the ground patterns P13 and P23 when viewed from the plate surface perpendicular direction. The component group overlapped with the ground patterns P13 and P23 among the components provided on the surface layers 31 and 32 is referred to as ground pattern overlapped components. The solid vias 35 connected to the ground pattern overlapped component are also overlapped with the ground patterns P13 and P23. For example, as shown in FIGS. 4 and 5, the solid vias 35 connected to the shunt resistors 237 to 239 and the solid vias 35 connected to the power supply relay 131 are also entirely overlapped with the ground patterns P13 and P23 when viewed from the plate surface perpendicular direction.

(Details of Power Supply Pattern)

The power supply patterns P11 to P22 are connected to the high potential side of the inverters 120 and 220 to supply an electric power. The power supply patterns P11 to P22 of the respective systems are electrically connected to the high-potential side terminals of the capacitors 134 and 234 and the power supply relays 132 and 232 in the surface layer 31 on the motor surface 301 side. The power supply patterns P11 to P22 of the respective systems are electrically connected to the high-potential side terminals of the switching elements 121 to 123 and 221 to 223.

The power supply patterns P11 to P22 shown in FIGS. 4 and 5 are a part of the power supply patterns provided in each of all the wiring layers, and other power supply patterns are omitted in the drawing. The illustrated power supply patterns P11 and P21 are provided on the surface layer 32 on the cover surface 302 side. The illustrated power supply patterns P12 and P22 are provided on the surface layer 31 on the motor surface 301 side.

The power supply patterns of the same systems provided in different wiring layers are connected to each other by the multiple solid vias 35 and the plating 36. For example, in FIGS. 4 and 5, the power supply patterns P12 and P22 of the surface layer 31 to which the first power supply relays 131 and 231 are connected and the power supply patterns P11 and P21 of the surface layer 32 are connected to each other by the multiple solid vias 35 and the plating 36.

The power supply pattern P11 of the first system L1 provided on the surface layer 32 is shaped to include the whole of the power supply terminal connection portion 151 and the coil 135 when viewed from the plate surface perpendicular direction. The power supply pattern P21 of the second system L2 provided on the surface layer 32 is similarly shaped to include the whole of the power supply terminal connection portion 251 and the coil 235 when viewed from the plate surface perpendicular direction. In other words, the whole of the power supply terminal connection portions 151 and 251 and the coils 135 and 235 are overlapped with the power supply patterns P11 and P21 when viewed from the plate surface perpendicular direction.

The power supply pattern P12 of the first system L1 provided on the surface layer 31 is shaped to include the whole of the switching elements 121 to 123 and the power supply relays 131 and 132 when viewed from the plate surface perpendicular direction. In the same manner, the power supply pattern P22 of the second system L2 provided on the surface layer 31 is shaped to include the whole of the switching elements 221 to 223 and the power supply relays 231 and 232 when viewed from the plate surface perpendicular direction. In other words, the switching elements 121 to 223 and the power supply relays 131 to 232 are entirely overlapped with the power supply patterns P12 and P22 when viewed from the plate surface perpendicular direction.

Among the components provided on the surface layer 31, the component group overlapped with the power supply patterns P12 and P22 is referred to as power supply pattern overlapped components. The solid vias 35 connected to the power supply pattern overlapped components are also overlapped with the power supply patterns P12 and P22. For example, as shown in FIGS. 4 and 5, the solid vias 35 connected to the power supply relays 131 and 231 are also overlapped with the power supply patterns P11 to P22 when viewed from the plate surface perpendicular direction.

The ground pattern P13 of the first system L1 is shaped to include the whole of the power supply patterns P11 and P12 of the first system L1 when viewed from the plate surface perpendicular direction. In the same manner, the ground pattern P23 of the second system L2 is shaped to include the whole of the power supply patterns P21 and P22 of the second system L2 when viewed from the plate surface perpendicular direction. In other words, the whole of the power supply patterns P11 to P22 is overlapped with the ground patterns P13 and P23 when viewed from the plate surface perpendicular direction.

The rotation angle sensor 29 is disposed in a region of the substrate 30 facing the opening 837a through which the rotation shaft 870 is inserted and disposed. This region corresponds to an opening facing region. The power supply pattern and the ground pattern are disposed at positions not overlapping with the rotation angle sensor 29 when viewed from the plate surface perpendicular direction.

(Solid Via Placement)

The multiple solid vias 35 include those disposed outside the switching elements 121 to 126 and 221 to 226 when viewed from the plate surface perpendicular direction. The solid vias 35 described above are referred to as the outer solid vias 351. The outer solid vias 351 correspond to outer conductive members. The outer solid vias 351 connect the power wiring patterns of the surface layers 31 and 32 on which the switching elements are mounted and the power wiring patterns of the inner layer 33 located next to the power wiring patterns.

In the example shown in FIG. 6, the output pattern P14a formed on the surface layer 33 on which the switching elements 121 and 124 are mounted and the output pattern P14*b* formed on the adjacent inner layer 33 are connected to each other by the outer solid vias 351. The switching elements 121 and 124 correspond to power elements.

Figure 7:
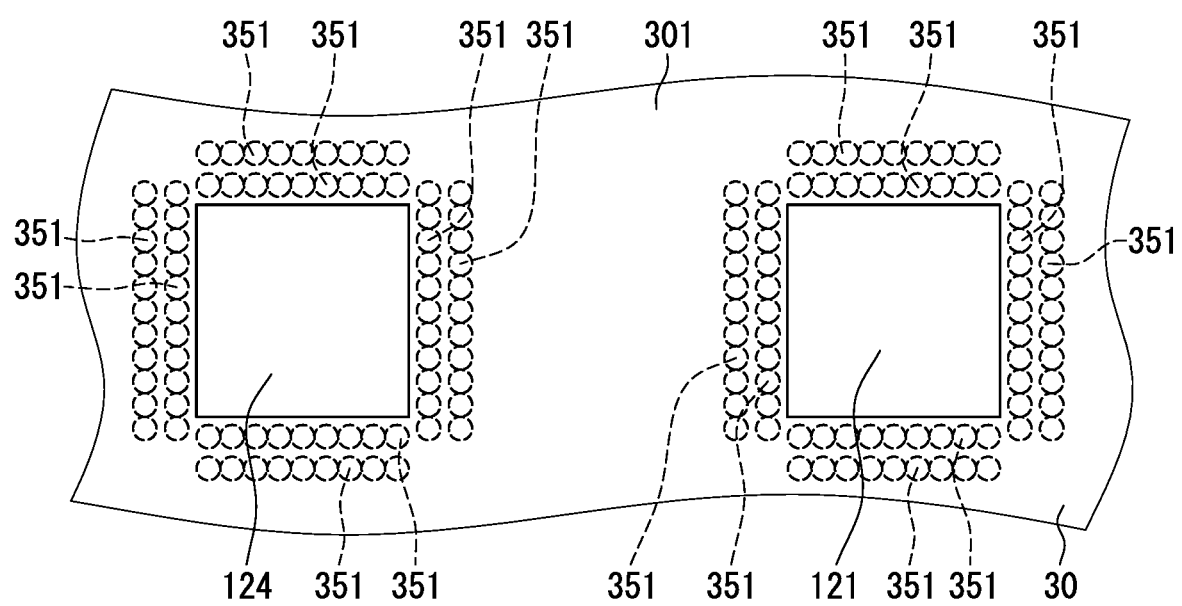
FIG. 7 is a view taken from an arrow VII of FIG. 6.

As shown in FIG. 7, the switching elements 121 and 124 have a rectangular shape when viewed from the plate surface perpendicular direction. The multiple outer solid vias 351 are aligned side by side along the above rectangular outline line. The multiple outer solid vias 351 are arranged annularly so as to surround the switching elements 121 and 124. In the example of FIG. 7, the outer solid vias 351 are arranged in a row in a rectangular shape around the switching elements 121 and 124, and the outer solid vias 351 are arranged in a row in a rectangular shape on a further outer side of the outer solid vias 351. In other words, two rows of outer solid vias 351 are provided around the switching elements 121 and 124.

A distance between the outer solid via 351 of a first row and the switching elements 121 and 124 is smaller than the maximum diameter of the outer solid vias 351. A distance between the outer solid via 351 of the first row and the outer solid via 351 of a second row is smaller than the maximum diameter of the outer solid vias 351. The output pattern P14*a* and P14*b* connected by the outer solid via 351 connect the switching element 121 of the upper arm and the switching element 124 of the lower arm.

In the wiring of the power wiring patterns P11 to P23 and P12*a*, P12*b*, P13*a*, P13*b*, P14*a*, and P14*b*, it may be preferable to increase the thickness of the wiring to lower the impedance in order to reduce the heat generation caused by allowing a large current to flow. When the wiring is thickened, a wiring width and a wiring gap may become large due to a substrate manufacturing restriction, and a fine wiring may not be formed. For that reason, it may be unsuitable to wire the control wiring patterns P12*a* and P12*b* requiring high-density layouts. Therefore, when both the power conversion circuit and the control circuit are provided on the same substrate to achieve miniaturization, the power wiring pattern and the control wiring pattern are mixed on the same substrate. Therefore, both a reduction in impedance and a miniaturization of wiring may be required.

According to the present embodiment, a multilayer substrate is used as the substrate 30 on which both of the power wiring patterns P11 to P23, P12*a*, P12*b*, P13*a*, P13*b*, P14*a*, and P14*b*, and the control wiring patterns P18 and P19 are provided. The power wiring patterns disposed in different layers of the multilayer substrate are electrically connected to each other by solid conductive members provided in the vias 35*a*. The solid vias 35 corresponds to a solid conductive member.

This makes it possible to make the power wiring pattern of multiple layers have an impedance equivalent to that of a single layer of thick wiring. In addition, since the vias are formed as the solid vias 35, the impedance can be further reduced as compared with the case of the film vias. In other words, the impedance can be lowered without thickening the power wiring pattern, and heat generation caused by a large current flowing through the power wiring pattern can be reduced. In addition, since the power wiring pattern can be inhibited from being thickened, the wiring widths and wiring gaps of the control wiring patterns P18 and P19 can be reduced, and fine wiring can be achieved.

Further, according to the present embodiment, the switching elements 121 and 124 (corresponding to power elements) included in the power conversion circuit are mounted on the surface layers 31 and 32 of the multilayer substrate. The solid vias 35 include the multiple outer solid vias 351 (corresponding to outer conductive members) disposed outside the power element when viewed from the plate surface perpendicular direction and disposed side by side along the outline line of the power element. According to the above configuration, since the outer solid vias 351 are positioned in a path of the current flowing through the power element, the effect of reducing the impedance can be attained.

Further, according to the present embodiment, the multiple outer solid vias 351 are disposed in an annular manner so as to surround the power element. For that reason, the effect of lowering the impedance is exhibited. In addition, a heat generated in the power element can be instantaneously dissipated from the power element to the outer solid vias 351 and stored. For example, in the case of the EPS 8, a large current flows instantaneously, so that the power element may instantaneously reach a high temperature. The heat is instantaneously stored in the outer solid vias 351, so that the power element can be inhibited from reaching a high temperature. Even if the heat radiation member is provided, the amount of heat that can be transferred instantaneously from the power element to the heat radiation member is limited. Even in the above case, the outer solid vias 351 are caused to function as heat radiation buffers, so that a temperature rise of the power element can be inhibited.

Further, in the present embodiment, the electric power conversion circuit supplies an electric power to the motor 80 of the EPS 8 which exhibits a steering force of the vehicle. Since the motor 80 for the EPS 8 has a property that a large current flows instantaneously, the effect of lowering the impedance is exhibited.

Further, in the present embodiment, the inner layer vias connected to the land outside solid vias 352 (corresponding to land outside conductive members) among the inner layer vias connecting the inner layers 33 of the multilayer substrate to each other are disposed so as not to overlap with the lands 30L when viewed from the plate surface perpendicular direction. According to the above configuration, since the solid vias 35 can be disposed outside the lands 30L, the possibility can be reduced that the heat of the laser processing damages the lands 30L when the solid vias 35 are produced by a laser.

Second Embodiment

Figure 8:
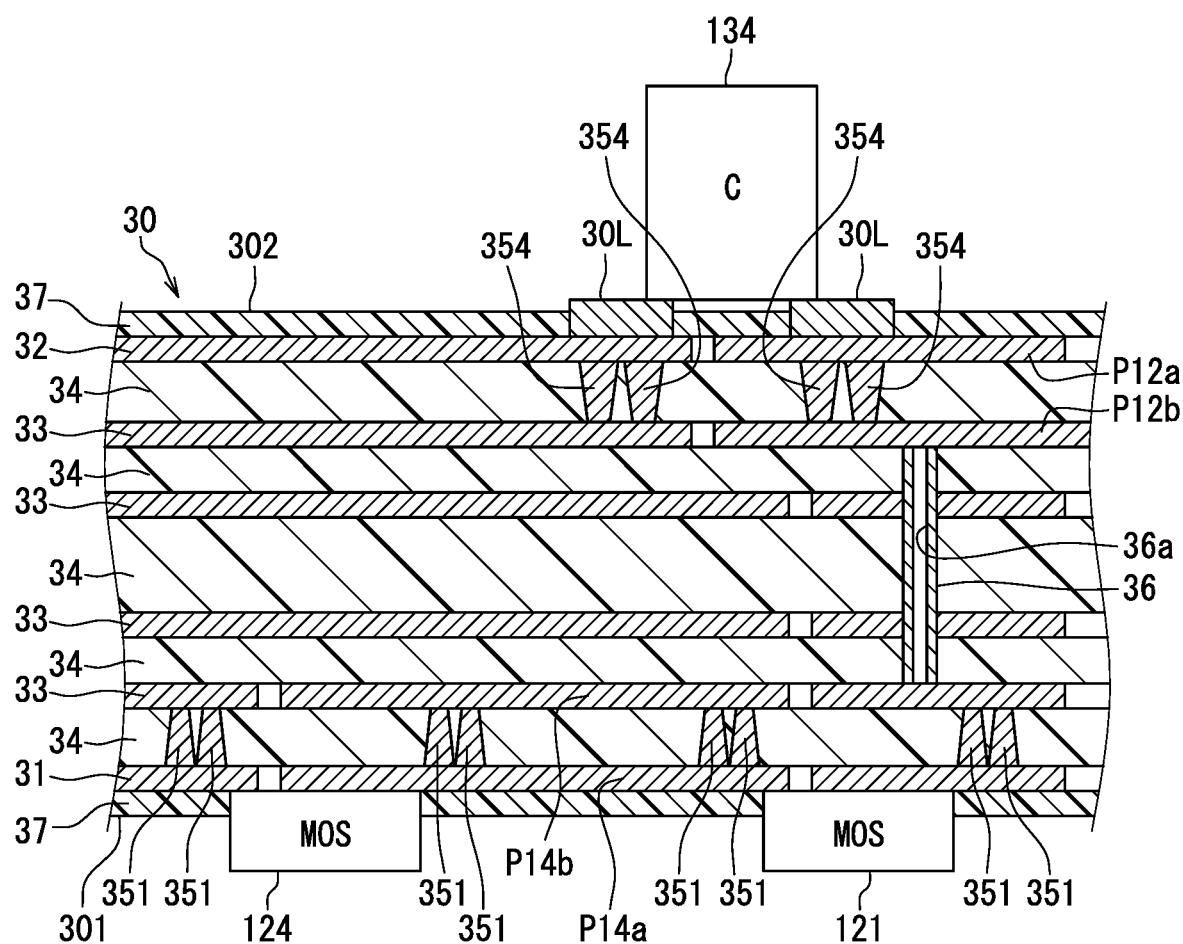
FIG. 8 is a cross-sectional view of an inverter according to a second embodiment.

In the first embodiment, the solid vias 35 include the land outside solid vias 352 (corresponding to land outside conductive members) disposed so as not to overlap with the lands 30L when viewed from the plate surface perpendicular direction. In the present embodiment, as shown in FIG. 8, land inside solid vias 354 (corresponding to land inside conductive members) are disposed so as to overlap with lands 30L when viewed from the plate surface perpendicular direction. The lands 30L illustrated in FIG. 8 are formed on a surface layer 32 of a substrate 30 and connected to a capacitor 134. The lands 30L are shaped to extend in a direction perpendicular to the plane of FIG. 8, and the multiple land inside solid vias 354 are disposed along the shape of the lands 30L in the direction perpendicular to the sheet plane.

According to the above configuration, the land inside solid vias 354 are disposed so as to overlap with the lands 30L when viewed from the plate surface perpendicular direction. For that reason, as compared with the case where the solid vias 35 are disposed around the lands 30L, a space for placing the wiring patterns and components around the lands 30L can be easily secured.

Third Embodiment

Figure 9:
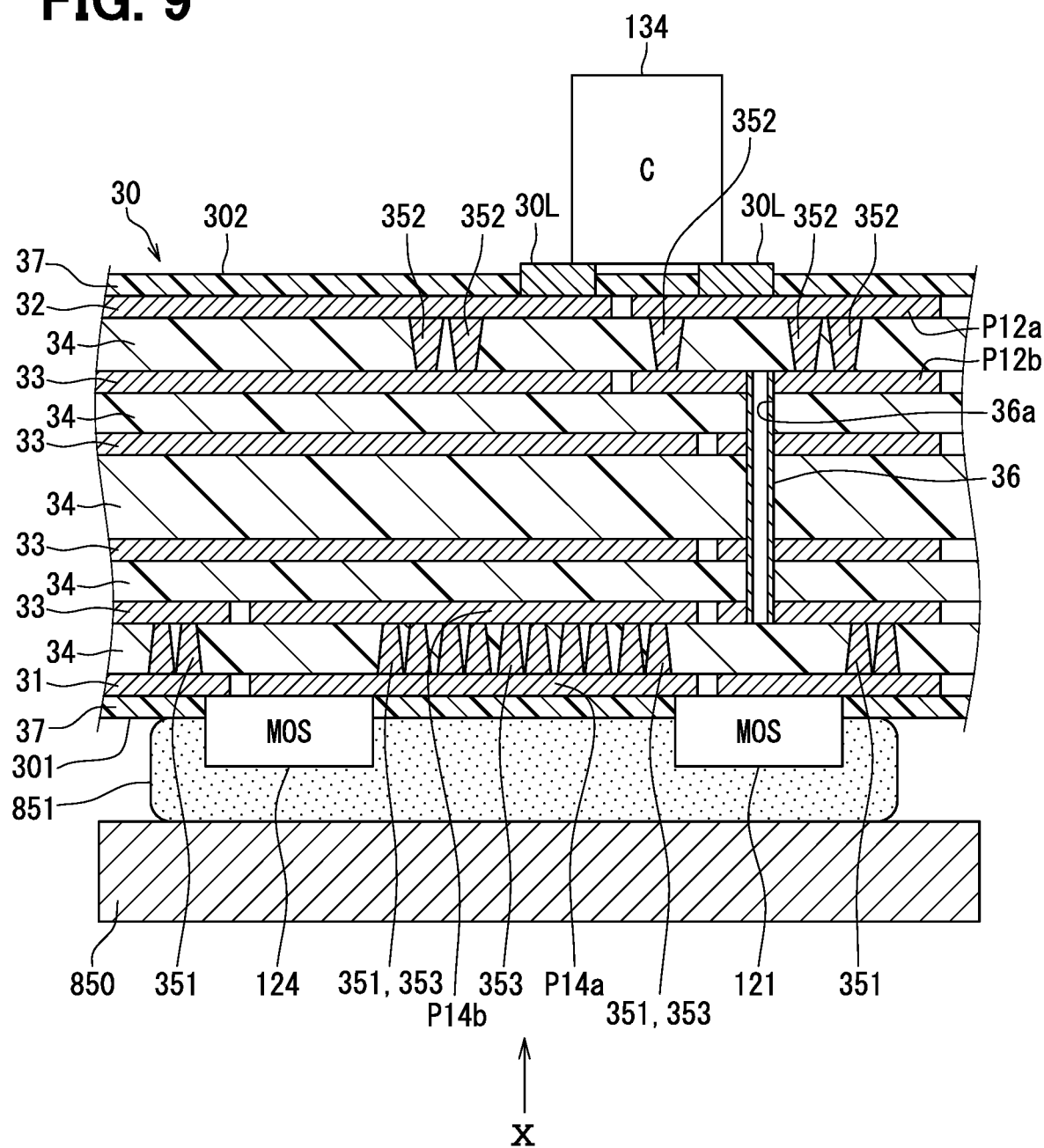
FIG. 9 is a cross-sectional view of an inverter according to a third embodiment.

In the present embodiment, as shown in FIG. 9, an ECU 10 includes a metallic heat radiation member 850 and a gel 851. The gel 851 corresponds to a deformation heat transfer material. The heat radiation member 850 may be an air-cooled heat exchanger that exchanges heat with an air around a substrate 30, or may be a water-cooled heat exchanger that exchanges a heat with a circulating coolant water.

The gel 851 is disposed in a deformed state between a surface of a power element or the substrate 30 and the heat radiation member 850. The gel 851 is brought in close contact with the power element, the substrate 30, and the heat radiation member 850. Although the above deformation is plastic deformation, a deformation heat transfer material that elastically deforms and is brought in close contact with the above members may be used instead of the gel 851. When the gel 851 is brought in contact with the above members in this manner, the heat of the power element and the substrate 30 is transmitted to the heat radiation member 850 through the gel 851, and is radiated to the air and the coolant water.

Solid vias 35 include solid vias 353 disposed so as to overlap with a region of the substrate 30 with which the gel 851 is brought in close contact when viewed from the plate surface perpendicular direction. The solid vias 35 described above are referred to as heat radiation solid vias 353. Outer solid vias 351 disposed around the power element also function as heat radiation solid vias. The solid vias 35 corresponds to conductive members. The heat radiation solid vias 353 correspond to heat radiation conductive members.

Figure 10:
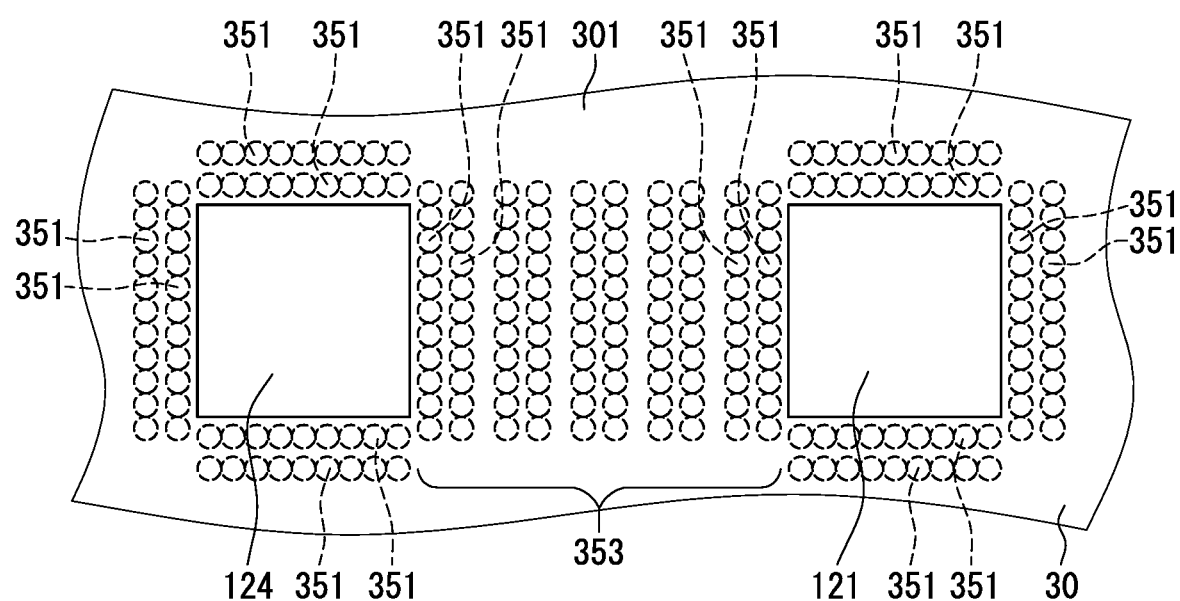
FIG. 10 is a view taken from an arrow X of FIG. 9.

In examples of FIGS. 9 and 10, a region of the substrate 30 between the two switching elements 121 and 124 corresponds to a region with which the gel 851 is brought in close contact. More than half of the region is occupied by the heat radiation solid vias 353.

As described above, according to the present embodiment, the multiple heat radiation solid vias 353 are provided in the region with which the gel 851 is brought in close contact. Those heat radiation solid vias 353 are superior in thermal conductivity to the insulating layer 34. For that reason, according to the present embodiment, the heat of the power wiring patterns located in the inner layers 33 such as the output pattern P14b is easily transferred to the gel 851 through the heat radiation solid vias 353. Therefore, the heat radiation of the power wiring patterns located in the inner layer 33 can be improved, and thus the heat radiation of the substrate 30 can be improved.

Other Embodiments

Although multiple embodiments of the present disclosure have been described above, not only the combinations of the configurations explicitly shown in the description of each embodiment, but also the configurations of multiple embodiments can be partially combined even if the combination is not explicitly shown if there is no problem in the combination in particular. Unspecified combinations of the configurations described in the multiple embodiments and the modification examples are also disclosed in the following description.

In each of the above embodiments, the solid vias 35 connect the power wiring patterns disposed in the adjacent layers, but may connect the power wiring patterns in the distant layers. The outer solid vias 351, all of the land outside solid vias 352, the heat radiation solid vias 353, and the land inside solid vias 354 according to the above embodiments may be formed in the substrate 30. At least one of those solid vias may be provided. Alternatively, the solid vias 35 that does not correspond to any of those solid vias may be provided, and the other solid vias may be eliminated.

In the embodiment shown in FIG. 8, both the power supply pattern and the ground pattern are disposed at positions not overlapping with the rotation angle sensor 29 when viewed from the plate surface perpendicular direction. On the other hand, at least one of the power supply pattern and the ground pattern may overlap with the rotation angle sensor 29.

In the example shown in FIG. 2, the opening 837a is provided in the rear frame end 837, and the rotation shaft 870 is inserted through the opening 837a. The magnet 875 attached to the tip of the rotation shaft 870 is exposed from the opening 837a and faces the rotation angle sensor 29. On the other hand, the opening 837a may be eliminated, and a part of the rear frame end 837 may be interposed between the rotation angle sensor 29 and the magnet 875. However, even in this case, it is desirable to dispose the rotation angle sensor 29 on the center line Ax of the rotation shaft 870.

In the embodiment shown in FIG. 1, the power conversion device includes the motor 80 for the EPS 8 motor 80 as a power supply target. On the other hand, another motor, such as a motor for vehicle travel, may be a power supply target. In the first embodiment, a circuit configuring the inverters 120 and 220 is applied to the power conversion circuit provided on the substrate 30, but a boosting circuit may be applied.

In the embodiment shown in FIG. 3, the components configuring the first system L1 and the components configuring the second system L2 in the drive device 1 are mounted on a single substrate 30. On the other hand, those components may be separately mounted on the multiple substrates. The components configuring the first system L1 include the first inverter 120, the first motor relays 127 to 129, the first power supply relays 131 and 132, the first capacitor 134, the first coil 135, and the like. The components configuring the second system L2 include the second inverter 220, the second motor relays 227 to 229, the second power supply relays 231 and 232, the second capacitor 234, and the second coil 235.

In the embodiment shown in FIG. 3, the switching elements 121 to 126, the motor relays 127 to 129, and the power supply relays 131, 132 are all MOSFET. On the other hand, an IGBT, a thyristor, or the like may be used. The power supply relays 131 and 132 may be mechanical relays. The second system L2 may be an IGBT, a thyristor, or a mechanical relay instead of the MOSFET in the same manner as the first system L1.

Although the embodiment shown in FIG. 3 includes an inter-system ground connection capacitor 41, the inter-system ground connection capacitor 41 may be eliminated. Although the embodiment shown in FIG. 3 includes electromechanical connection capacitors 142 and 242, those electromechanical connection capacitors 142 and 242 may be eliminated. In this case, it may be omitted that the ground pattern for each system or the power supply pattern for each system is divided and disposed in each region separated by the slit 305.

The inter-system ground connection capacitor 41 is mounted on the substrate 30 and electrically connects the ground of each system. This makes it possible to form a path for feeding back the noise propagated to the other system side through the motor windings 180 and 280 and the like to the host system on the substrate 30. The electromechanical connection capacitors 142 and 242 connect the housing connection patterns 156, 157, 256, and 257 to the ground pattern of the substrate 30. This makes it possible to form a low-impedance path for feeding back the noises propagated to the motor 80 side to the ECU 10 including the inverters 120 and 220. Therefore, the propagation of noise to the outside of the drive device 1, such as a vehicle, can be reduced.

In the first embodiment, the power conversion circuit and the control circuit for controlling the operation of the power conversion circuit are provided on one common substrate 30. The power conversion circuit is provided by the inverters 120 and 220, and the control circuit is provided by the microcomputers 170 and 270 and the pre-drivers 176 and 276. Both the power wiring pattern of the power conversion circuit and the control wiring pattern (not illustrated) of the control circuit are formed on the substrate 30. Specific examples of the power wiring patterns include the ground patterns P13 and P23, the power supply patterns P11 and P21, and the like. Alternatively, the power conversion circuit and the control circuit may be provided on separate substrates. However, the substrate 30 on which the solid vias 35 are provided has at least a part of the power wiring patterns and at least a part of the control wiring patterns.

In the first embodiment, a control circuit is provided for each of the power conversion circuits of the two systems, and the control circuit is also configured in two systems. On the other hand, a control circuit may be common to each of the power conversion circuits of the two systems, and the control circuit may be configured as a single system. In addition, all the circuits including the power conversion circuit may be configured as one system.

The inverter 120 corresponds to a power conversion device. The inverter 220 corresponds to a power conversion device. The microcomputers 170 and 270, the pre-driver 176, and the pre-driver 276 correspond to a control circuit. The substrate 30 corresponds to a multilayer substrate. The solid via 35 corresponds to a conductive member. The outer solid via 351 corresponds to an outer conductive member. The heat radiation solid via 353 corresponds to a heat radiation conductive member. The land inside solid via 354 corresponds to a land inside conductive member. The inner via 35a corresponds to a via. Each of the switching elements 121 and 124 corresponds to a power element.

While various embodiments, configurations, and aspects of a power conversion device according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A power conversion device comprising:
   a power conversion circuit that is configured to convert a supplied electric power to output a converted power;
   a control circuit that is configured to control an operation of the power conversion circuit;
   a multilayer substrate comprising different layers including a plurality of surface layers, power wiring patterns of the power conversion circuit and a control wiring pattern of the control circuit being arranged on the multilayer substrate, the power wiring patterns being disposed in different layers of the multilayer substrate;
   a via that extends across the power wiring patterns in the different layers; and
   a solid-shaped conductive member that is provided in the via to electrically connect the respective power wiring patterns to each other, wherein:
   the power conversion circuit includes a power element;
   the power element is mounted on a surface layer of the plurality of surface layers of the multilayer substrate;
   the solid-shaped conductive member includes a plurality of outer conductive members that are disposed outside a perimeter of the power element when viewed in a direction perpendicular to a plate surface of the multilayer substrate and disposed along an outline line of the power element; and
   the via extends from one of the plurality of surface layers of the multilayer substrate to one inner layer that is adjacent to the one of the plurality of surface layers, the via directly connecting the one of the plurality of surface layers to the one inner layer.

2. The power conversion device according to claim 1, wherein:
   the plurality of outer conductive members are annularly arranged surrounding the power element.

3. The power conversion device according to claim 1, wherein:
   the solid-shaped conductive member includes a land inside conductive member; and
   the land inside conductive member is disposed to overlap with a land provided on a surface layer of the plurality of surface layers of the multilayer substrate in a direction perpendicular to a plate surface of the multilayer substrate, and connected to the land.

4. The power conversion device according to claim 1, wherein:
   the solid-shaped conductive member includes a land outside conductive member; and
   the land outside conductive member is disposed to be outside of a land provided on a surface layer of the plurality of surface layers of the multilayer substrate in a direction perpendicular to a plate surface of the multilayer substrate, and connected to the land,
   the power conversion device further comprising an inner layer via connecting inner layers of the multilayer substrate to each other,
   wherein:
   a particular inner layer via which is connected to the land outside conductive member among the inner layer via is disposed to overlap with the land in a direction perpendicular to a plate surface of the multilayer substrate.

5. The power conversion device according to claim 1, further comprising:
   a deformation heat transfer material that is deformed and adhered to a power element of the power conversion circuit, and is deformed and adhered to the multilayer substrate,
   wherein:
   the solid-shaped conductive member includes a heat radiation conductive member that is disposed to overlap with a region of the multilayer substrate to which the deformation heat transfer material adheres in a direction perpendicular to a plate surface of the multilayer substrate.

6. The power conversion device according to claim 1, wherein:
the power conversion circuit supplies an electric power to a motor that exerts a steering force of a vehicle.

7. A power conversion device comprising:
a power conversion circuit that is configured to convert a supplied electric power to output a converted power;
a control circuit that is configured to control an operation of the power conversion circuit;
a multilayer substrate that has different layers, power wiring patterns of the power conversion circuit and a control wiring pattern of the control circuit being arranged on the multilayer substrate, the power wiring patterns being disposed in different layers of the multilayer substrate;
a via that extends across the power wiring patterns in the different layers; and
a solid-shaped conductive member that is provided in the via to electrically connect the respective power wiring patterns to each other, wherein:
the solid-shaped conductive member includes a land outside conductive member; and
the land outside conductive member is disposed to be out of a land provided on a surface layer of the multilayer substrate in a direction perpendicular to a plate surface of the multilayer substrate, and connected to the land,
the power conversion device further comprising an inner layer via connecting inner layers of the multilayer substrate to each other,
wherein:
a particular inner layer via which is connected to the land outside conductive member among the inner layer via is disposed to overlap with the land in a direction perpendicular to a plate surface of the multilayer substrate.

* * * * *